United States Patent
Ji

(10) Patent No.: US 11,935,616 B2
(45) Date of Patent: Mar. 19, 2024

(54) COMPARISON SYSTEM

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 171 days.

(21) Appl. No.: 17/669,565

(22) Filed: Feb. 11, 2022

(65) Prior Publication Data

US 2022/0223186 A1 Jul. 14, 2022

Related U.S. Application Data

(63) Continuation of application No. PCT/CN2021/111486, filed on Aug. 9, 2021.

(30) Foreign Application Priority Data

Jan. 14, 2021 (CN) .......................... 202110049123.4

(51) Int. Cl.
*G11C 7/00* (2006.01)
*G11C 7/10* (2006.01)
(Continued)

(52) U.S. Cl.
CPC .......... *G11C 7/1039* (2013.01); *G11C 7/1069* (2013.01); *G11C 7/1096* (2013.01);
(Continued)

(58) Field of Classification Search
CPC .................................. H03K 19/20; G11C 29/42
See application file for complete search history.

(56) References Cited

U.S. PATENT DOCUMENTS 4,084,236 A 4/1978 Chelberg
4,622,602 A 11/1986 Kutaragi
(Continued)

FOREIGN PATENT DOCUMENTS

CN 1242088 A 1/2000
CN 1881477 A 12/2006
(Continued)

OTHER PUBLICATIONS

First Office Action of the Japanese application No. 2022-538713, dated Aug. 1, 2023. 8 pages with English translation.
(Continued)

*Primary Examiner* — Uyen Smet
(74) *Attorney, Agent, or Firm* — Cooper Legal Group, LLC

(57) ABSTRACT

Embodiments of the disclosure provide a comparison system including at least one comparison circuit, the comparison circuit including: a common circuit, connected to a power supply signal and a ground signal, and configured to control output of the power supply signal or the ground signal based on a first signal and a second signal which are inverted; a first logical circuit, connected to the common circuit, and configured to receive a third signal and a fourth signal which are inverted, and output a first operation signal which is an exclusive OR (XOR) of the first signal and the third signal; and a second logical circuit, connected to the common circuit, and configured to receive the third signal and the fourth signal, and output a second operation signal which is a not exclusive OR (XNOR) of the first signal and the third signal.

14 Claims, 5 Drawing Sheets

(51) Int. Cl.
  *H03K 19/0175* (2006.01)
  *H03K 19/17784* (2020.01)
  *H03K 19/20* (2006.01)
(52) U.S. Cl.
  CPC .............. *H03K 19/017509* (2013.01); *H03K 19/17784* (2013.01); *H03K 19/20* (2013.01)

(56) References Cited

U.S. PATENT DOCUMENTS

| | | | |
|---|---|---|---|
| 4,730,321 | A | 3/1988 | Machado |
| 4,736,376 | A * | 4/1988 | Stiffler .................... G06F 11/10 714/801 |
| 4,749,886 | A * | 6/1988 | Hedayati .............. H03K 19/215 326/54 |
| 5,859,858 | A | 1/1999 | Leeman |
| 5,936,870 | A | 8/1999 | Im |
| 6,891,690 | B2 | 5/2005 | Asano |
| 7,242,219 | B1 | 7/2007 | Mahurin |
| 7,653,862 | B2 | 1/2010 | Hassner |
| 8,225,175 | B2 | 7/2012 | Chen |
| 8,560,916 | B2 | 10/2013 | Yang |
| 8,862,963 | B2 | 10/2014 | Nakanishi |
| 9,411,686 | B2 | 8/2016 | Yang et al. |
| 9,754,684 | B2 | 9/2017 | Hu et al. |
| 9,985,655 | B2 | 5/2018 | Jeganathan et al. |
| 9,985,656 | B2 | 5/2018 | Jeganathan et al. |
| 11,239,944 | B1 | 2/2022 | Pan |
| 11,599,417 | B2 | 3/2023 | Ji |
| 2004/0015680 | A1 | 1/2004 | Matsuo |
| 2004/0095666 | A1 | 5/2004 | Asano |
| 2005/0273678 | A1 | 12/2005 | Dietrich |
| 2007/0011598 | A1 | 1/2007 | Hassner |
| 2009/0106633 | A1 | 4/2009 | Fujiwara |
| 2009/0217140 | A1 | 8/2009 | Jo |
| 2010/0185904 | A1 | 7/2010 | Chen |
| 2011/0191651 | A1 | 8/2011 | Chen |
| 2011/0239082 | A1 | 9/2011 | Yang |
| 2012/0311408 | A1 | 12/2012 | Nakanishi |
| 2013/0162293 | A1 | 6/2013 | Lilja |
| 2015/0058700 | A1 | 2/2015 | Yang et al. |
| 2016/0080002 | A1 | 3/2016 | Ramaraju |
| 2017/0060677 | A1 | 3/2017 | Jeganathan et al. |
| 2017/0060679 | A1 | 3/2017 | Jeganathan et al. |
| 2017/0091024 | A1 | 3/2017 | Bandic |
| 2017/0185478 | A1 | 6/2017 | Sakai |
| 2017/0222664 | A1 | 8/2017 | Tsuboi |
| 2017/0353271 | A1 | 12/2017 | Kudekar et al. |
| 2018/0060166 | A1 | 3/2018 | Lee |
| 2018/0205498 | A1 | 7/2018 | Kudekar et al. |
| 2019/0034270 | A1 | 1/2019 | Byun et al. |
| 2019/0146870 | A1 | 5/2019 | Cha |
| 2019/0280817 | A1 | 9/2019 | Kudekar et al. |
| 2021/0089392 | A1 | 3/2021 | Shirakawa |
| 2022/0223186 | A1 | 7/2022 | Ji |
| 2022/0223221 | A1 | 7/2022 | Ji |
| 2022/0230701 | A1 | 7/2022 | Ji |
| 2022/0365844 | A1 | 11/2022 | Ji |

FOREIGN PATENT DOCUMENTS

| | | |
|---|---|---|
| CN | 101183565 A | 5/2008 |
| CN | 101980339 A | 2/2011 |
| CN | 102339641 A | 2/2012 |
| CN | 102543209 A | 7/2012 |
| CN | 102810336 A | 12/2012 |
| CN | 102857217 A | 1/2013 |
| CN | 103078629 A | 5/2013 |
| CN | 104425019 A | 3/2015 |
| CN | 105471425 A | 4/2016 |
| CN | 105471425 B | 5/2018 |
| CN | 108038023 A | 5/2018 |
| CN | 109036493 A | 12/2018 |
| CN | 109308228 A | 2/2019 |
| CN | 110968450 A | 4/2020 |
| CN | 111443887 A | 7/2020 |
| JP | S61277230 A | 12/1986 |
| JP | S62210735 A | 9/1987 |
| JP | S63102510 A | 5/1988 |
| JP | H07111463 A | 4/1995 |
| JP | H07212222 A | 8/1995 |
| JP | 2010079485 A | 4/2010 |
| JP | 2012022422 A | 2/2012 |
| JP | 2013074560 A | 4/2013 |

OTHER PUBLICATIONS

International Search Report in the international application No. PCT/CN2021/111486, dated Nov. 9, 2021, 2 pages.
English translation of the Written Opinion of the International Search Authority in the international application No. PCT/CN2021/111486, dated Nov. 9, 2021, 3 pages.
Supplementary European Search Report in the European application No. 21854922.8, dated Nov. 8, 2022, 8 pages.
International Search Report in the international application No. PCT/CN2021/111414, dated Nov. 11, 2021, 2 pages.
First Office Action of the U.S. Appl. No. 17/627,013, dated Jun. 8, 2023. 38 pages.
Supplementary European Search Report in the European application No. 21863077.0, dated Jun. 29, 2023, 8 pages.
First Office Action of the Japanese application No. 2022-538785, dated Aug. 22, 2023, 5 pages with English translation.
International Search Report in the international application No. PCT/CN2021/112699, dated Oct. 26, 2021, 2 pages.
English translation of the Written Opinion of the International Search Authority in the international application No. PCT/CN2021/112699, dated Oct. 26, 2021, 4 pages.
Notice of Allowance of the U.S. Appl. No. 17/668,715, dated Jun. 16, 2023. 40 pages.
Notice of Allowance of the Japanese application No. 2022-538835, dated Aug. 8, 2023. 3 pages with English translation.
Supplementary European Search Report in the European application No. 21854865.9, dated Oct. 7, 2022, 5 pages.
English translation of the Written Opinion of the International Search Authority in the international application No. PCT/CN2021/111414, dated Nov. 11, 2021, 4 pages.
International Search Report in the international application No. PCT/CN2021/111492, dated Nov. 9, 2021, 2 pages.
English translation of the Written Opinion of the International Search Authority in the international application No. PCT/CN2021/111492, dated Nov. 9, 2021, 3 pages.
First Office Action of the U.S. Appl. No. 17/657,942, dated Mar. 10, 2023. 18 pages.
Notice of Allowance of the U.S. Appl. No. 17/657,942, dated May 22, 2023. 22 pages.
International Search Report in the international application No. PCT/CN2021/111426, dated Nov. 9, 2021, 2 pages.
English translation of the Written Opinion of the International Search Authority in the international application No. PCT/CN2021/111426, dated Nov. 9, 2021, 4 pages.
Notice of Allowance of the U.S. Appl. No. 17/582,185, dated Jan. 20, 2023. 20 pages.
Second Office Action of the Japanese application No. 2022-538713, dated Jan. 23, 2024, 9 pages with English translation.

* cited by examiner

FIG. 5

| Byte | 0 | | | | | | | |
|---|---|---|---|---|---|---|---|---|
| Bit | 0 | 1 | 2 | 3 | 4 | 5 | 6 | 7 |
| pc0 | | × | | × | | × | | × |
| pc1 | | | × | × | | | × | × |
| pc2 | | | | | × | × | × | × |

| Byte | 0 | 1 | 2 | 3 | 4 | 5 | 6 | 7 | 15 | 14 | 13 | 12 | 11 | 10 | 9 | 8 |
|---|---|---|---|---|---|---|---|---|---|---|---|---|---|---|---|---|
| pc3 | × | | × | × | × | × | × | | | | | | | | | × |
| pc4 | × | × | | | × | × | | × | | | | × | | × | × | |
| pc5 | | × | × | | × | | × | | | × | × | | × | | × | |
| pc6 | | | | × | | × | × | × | × | × | | | × | × | | |
| pc7 | | | | | | | | | × | | × | × | × | × | × | × |

COMPARISON SYSTEM

CROSS-REFERENCE TO RELATED APPLICATIONS

This is a continuation of International Application No. PCT/CN2021/111486, filed on Aug. 9, 2021, which is based on and claims priority to Chinese Patent Application No. 202110049123.4, filed on Jan. 14, 2021. The entire contents of International Application No. PCT/CN2021/111486 and Chinese Patent Application No. 202110049123.4 are incorporated herein by reference.

TECHNICAL FIELD

Embodiments of the disclosure relate to, but are not limited to, a comparison system.

BACKGROUND

Semiconductor memories may be divided into non-volatile memories and volatile memories. As a volatile memory, Dynamic Random Access Memory (DRAM) has advantages of high memory density, fast read and write speed, etc., and thus is widely used in various electronic systems.

As the process of DRAM becomes more and more advanced and the memory density thereof becomes higher and higher, errors may occur when data is stored in DRAM, seriously affecting the performance of DRAM. Thus, Error Checking and Correction (ECC) or Error correction Coding (ECC) techniques are commonly used in DRAM to detect or correct errors in stored data.

SUMMARY

Embodiments of the disclosure provide a comparison system including at least one comparison circuit, the comparison circuit including: a common module, connected to a power supply signal and a ground signal, and configured to control output of the power supply signal or the ground signal based on a first signal and a second signal which are inverted; a first logical unit, connected to the common module, and configured to receive a third signal and a fourth signal which are inverted, and output a first operation signal which is an exclusive OR (XOR) of the first signal and the third signal; and a second logical unit, connected to the common module, and configured to receive the third signal and the fourth signal, and output a second operation signal which is a not exclusive OR (XNOR) of the first signal and the third signal.

BRIEF DESCRIPTION OF THE DRAWINGS

One or more embodiments are exemplified by pictures in accompanying drawings corresponding thereto, which do not constitute limitations of the embodiments. An element having the same reference numeral in the drawings is designated as a similar element, and figures in the drawings do not constitute limitations of a scale, unless stated specifically.

FIG. 5 is a schematic diagram of a classification of multiple data and a relationship thereof with first check codes and second check codes according to an embodiment of the disclosure;

DETAILED DESCRIPTION

Embodiments of the disclosure provide a comparison system in which a first logical unit configured to implement an XOR operation and a second logical unit configured to implement an XNOR operation share a common module, which facilitates to reduce a circuit area, while the first logical unit and the second logical unit may be set to have larger areas respectively, so that driving capability of the first logical unit and the second logical unit may be further improved, and operation speeds of the XOR operation and the XNOR operation may be improved, thereby facilitating a memory system to improve speeds of error detection and error correction.

In order to make the objectives, technical solutions and advantages of the embodiments of the disclosure clearer, the embodiments of the disclosure will be described in detail below with reference to the accompanying drawings. However, it may be understood by those of ordinary skill in the art that in the embodiments of the disclosure, many technical details have been proposed for a reader to better understand the disclosure. However, even without these technical details and various changes and modifications based on the following embodiments, the technical solutions claimed herein may be realized.

Figure 1:
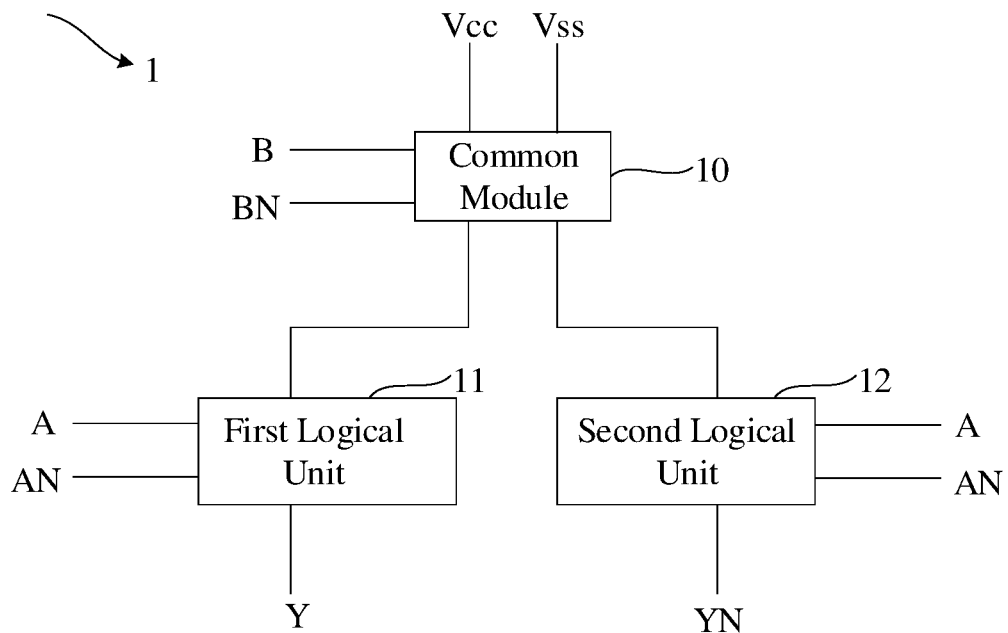
FIG. 1 is a functional block diagram of a comparison circuit in a comparison system according to an embodiment of the disclosure.
Figure 2:
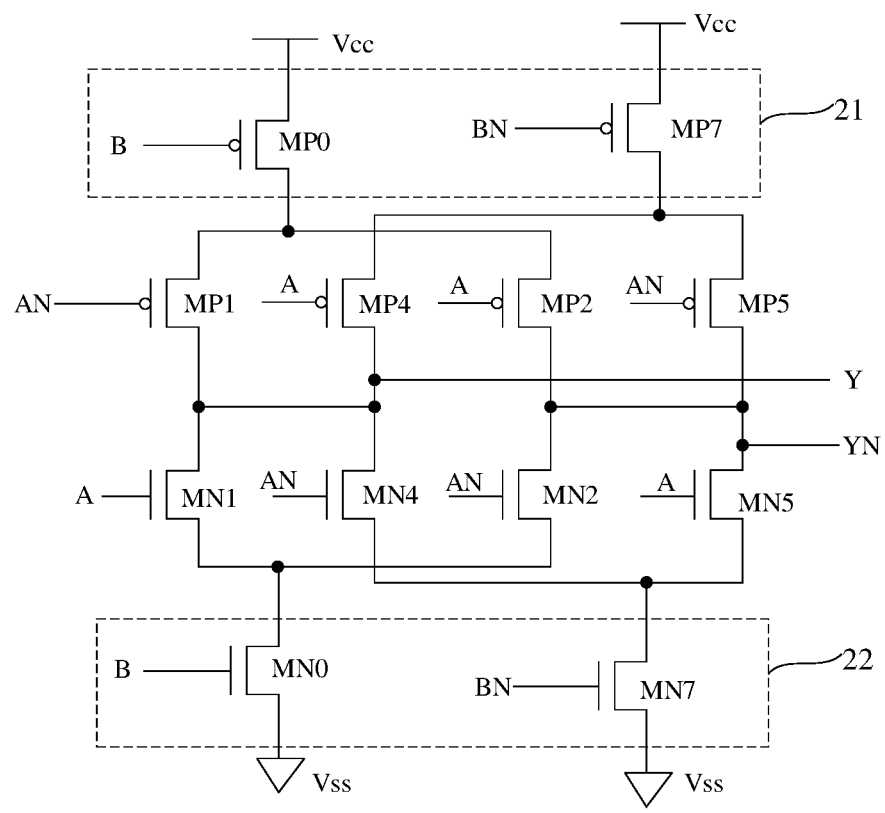
FIG. 2 is a schematic structural diagram of a comparison circuit in a comparison system according to an embodiment of the disclosure.
Figure 3:
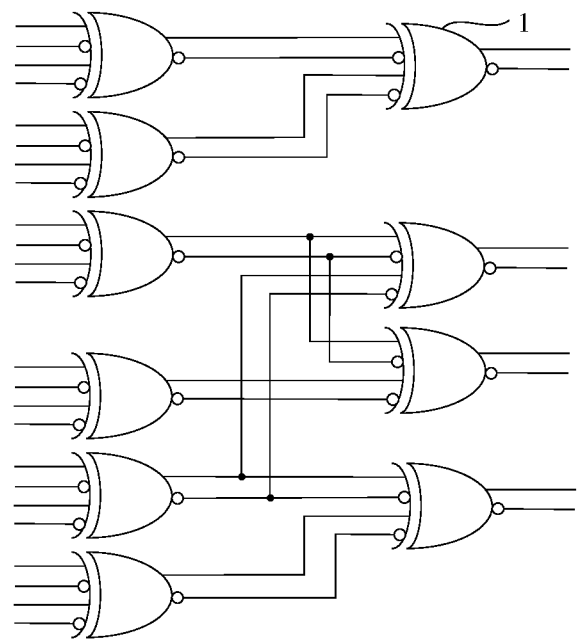
FIG. 3 is a schematic structural diagram of a circuit of a comparison system according to an embodiment of the disclosure.

FIG. 1 is a functional block diagram of a comparison circuit in a comparison system according to an embodiment of the disclosure, FIG. 2 is a schematic structural diagram of a comparison circuit in a comparison system according to an embodiment of the disclosure, and FIG. 3 is a schematic structural diagram of a circuit of a comparison system according to an embodiment of the disclosure.

Referring to FIG. 1, in the embodiment of the disclosure, the comparison system includes at least one comparison circuit 1, the comparison circuit 1 includes: a common module 10, connected to a power supply signal Vcc and a ground signal Vss, and configured to control output of the power supply signal Vcc or the ground signal Vss based on a first signal B and a second signal BN which are inverted; a first logical unit 11, connected to the common module 10, and configured to receive a third signal A and a fourth signal AN which are inverted, and output a first operation signal Y which is an XOR of the first signal B and the third signal A;

and a second logical unit 12, connected to the common module 10, and configured to receive the third signal A and the fourth signal AN, and output a second operation signal YN which is an XNOR of the first signal B and the third signal A.

It should be noted that connecting lines between the common module 10 and the first and second logical units 11 and 12 represent signal transmission relationships therebetween, and do not represent that there is only one signal line, instead there may be one signal line or multiple signal lines.

The comparison system provided by the embodiment of the disclosure will be described in detail below with reference to the accompanying drawings.

In the embodiment of the disclosure, referring to FIG. 2, the common module 10 (referring to FIG. 1) includes: a first common unit 21, connected to the power supply signal Vcc and configured to control output of the power supply signal Vcc based on the first signal B and the second signal BN; and a second common unit 22, connected to the ground signal Vss and configured to control output of the ground signal Vss based on the first signal B and the second signal BN, here the first logical unit 11 (referring to FIG. 1) is connected between the first common unit 21 and the second common unit 22, and the second logical unit 12 (referring to FIG. 1) is connected between the first common unit 21 and the second common unit 22.

In the embodiment of the disclosure, referring to FIG. 2, the first common unit 21 includes: a zeroth P-channel Metal Oxide Semiconductor (PMOS) transistor MP0, having a gate for receiving the first signal B and a source connected to the power supply signal Vcc; and a seventh PMOS transistor MP7, having a gate for receiving the second signal BN and a source connected to the power supply signal Vcc. When the first signal B is at a high level and the second signal BN is at a low level, the zeroth PMOS transistor MP0 is turned off and the seventh PMOS transistor MP7 is turned on; and when the first signal B is at a low level and the second signal BN is at a high level, the zeroth PMOS transistor MP0 is turned on and the seventh PMOS transistor MP7 is turned off.

The second common unit 22 includes: a zeroth N-channel Metal Oxide Semiconductor (NMOS) transistor MN0, having a gate for receiving the first signal B and a source connected to the ground signal Vss; and a seventh NMOS transistor MN7, having a gate for receiving the second signal BN and a source connected to the ground signal Vss. When the first signal B is at a high level and the second signal BN is at a low level, the zeroth NMOS transistor MN0 is turned on and the seventh NMOS transistor MN7 is turned off; and when the first signal B is at a low level and the second signal BN is at a high level, the zeroth NMOS transistor MN0 is turned off and the seventh NMOS transistor MN7 is turned on.

In the embodiment of the disclosure, the first logical unit 11 includes: a first PMOS transistor MP1, having a gate for receiving the fourth signal AN and a source connected to a drain of the zeroth PMOS transistor MP0; a first NMOS transistor MN1, having a gate for receiving the third signal A, a drain connected to a drain of the first PMOS transistor MP1, and a source connected to a drain of the zeroth NMOS transistor MN0; a fourth PMOS transistor MP4, having a gate for receiving the third signal A and a source connected to a drain of the seventh PMOS transistor MP7; and a fourth NMOS transistor MN4, having a gate for receiving the fourth signal AN, a drain connected to a drain of the fourth PMOS transistor MP4, and a source connected to a drain of the seventh NMOS transistor MN7.

The second logical unit 12 includes: a second PMOS transistor MP2, having a gate for receiving the third signal A and a source connected to a drain of the zeroth PMOS transistor MP0; a second NMOS transistor MN2, having a gate for receiving the fourth signal AN, a drain connected to a drain of the second PMOS transistor MP2, and a source connected to a drain of the zeroth NMOS transistor MN0; a fifth PMOS transistor MP5, having a gate for receiving the fourth signal AN and a source connected to a drain of the seventh PMOS transistor MP7; and a fifth NMOS transistor MN5, having a gate for receiving the third signal A, a drain connected to a drain of the fifth PMOS transistor MP5, and a source connected to a drain of the seventh NMOS transistor MN7.

Furthermore, a drain of the first PMOS transistor MP1 is connected to a drain of the fourth PMOS transistor MP4, to output a first operation signal Y; a drain of the second PMOS transistor MP2 is connected to a drain of the fifth PMOS transistor MP5, to output a second operation signal YN.

Furthermore, as shown in FIG. 3, the comparison system may further include multiple comparison circuits 1, here an output of a part of the comparison circuits 1 may be used as an input of other comparison circuits 1. The comparison system may be applied to a memory system, for example, may be used in an error correction code technology for the memory system.

In the comparison system provided by the embodiment of the disclosure, the first logical unit 11 configured to implement XOR logic and the second logical unit 12 configured to implement XNOR logic are connected to the same common module 10, thus an area occupied by the structure of the circuit of the common module 10 may be reduced, while the circuit area corresponding to the first logical unit 11 and the circuit area corresponding to the second logical unit 12 may be further set to be larger, so that driving capability of the first logical unit 11 and the second logical unit 12 may be improved, and operation speeds of the comparison system performing the XOR operation and the XNOR operation may be further improved.

In some embodiments of the disclosure, a comparison system is further provided. The comparison system is substantially the same as the foregoing embodiment, except that the comparison system may also be applied to a memory system. The comparison system will be described in detail below with reference to the accompanying drawings. It should be noted that the parts which are the same as or correspond to the foregoing embodiment may refer to the detailed descriptions of the foregoing embodiment, and will not be elaborated here.

Figure 4:
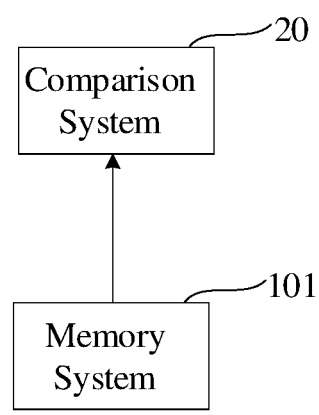
FIG. 4 is a schematic diagram of a comparison system and a memory system according to an embodiment of the disclosure.

FIG. 4 is a schematic diagram of a comparison system and a memory system according to an embodiment of the disclosure.

In some embodiments of the disclosure, the comparison system 20 includes at least one comparison circuit, the comparison circuit includes a common module, a first logical unit and a second logical unit. For descriptions of the specific structure of the comparison circuit, it may refer to the detailed descriptions of the foregoing embodiment.

In the embodiment of the disclosure, as shown in FIG. 4, the comparison system 20 is applied to the memory system 101 which is configured to write or read, during a read or write operation, multiple data, here the multiple data are divided into M bytes, each having N data, and each of M and N is a positive natural number.

The comparison system 20 is configured to receive the multiple data, each used as the first signal or the third signal, and perform a first encoding operation based on a subset of the data in each of the bytes to generate X first check codes, each based on a subset of the data at fixed bits among all the bytes, and perform a second encoding operation based on all data in a subset of the bytes to generate Y second check codes, here the X first check codes are configured for at least one of error detection or error correction on the N data in each of the bytes, and the Y second check codes are configured for at least one of error detection or error correction on the M bytes; and each of X and Y is a positive natural number.

In the embodiment of the disclosure, the memory system 101 may be a DRAM, and for example, may be Double Data Rate4 (DDR4), Low Power DDR4 (LPDDR4), DDR5, or LPDDR5. The memory system 101 may be other types of memory systems, such as non-volatile memories such as NAND, NOR, Ferroelectric Random Access Memory (Fe-RAM), Phase change Random Access Memory (PcRAM), and the like. In the memory system 101, data is partitioned into different bytes, and the first check code(s) is/are configured for at least one of error detection or error correction on N data in each of the bytes, and the second check code(s) is/are configured for at least one of error detection or error correction on M bytes. The encoding mode based on error detection and error correction may not only implement ECC, but also implement ECC by using fewer hardware circuits, which facilitates to reduce power consumption of the memory system and optimize the speed and result of ECC.

It should be noted that in the embodiment of the disclosure, the first check code(s) is/are configured for at least one of error detection or error correction on N data in each of the bytes, and the second check code(s) is/are configured for at least one of error detection or error correction on M bytes. It should be understood that all the first check codes and the second check codes are configured together for at least one of error detection or error correction on all data in the M bytes, the second check code(s) is/are configured to locate one of the M bytes where erroneous data is located, and the first check code(s) is/are configured to locate one of the bits, where erroneous data is located, of the byte.

Typically, a byte is a basic unit in data processing. The information is stored and interpreted in bytes, and it is specified that one byte is composed of eight binary bits, that is, one byte is equal to eight bits, each of which has a respective bit, i.e., 1 Byte=8 bits. Based on this, in the embodiment of the disclosure, N is eight to maximize the bits in each byte, thereby facilitating to increase a utilization rate of a circuit required by the comparison system 20. It may be understood that in other embodiments, N may also be another suitable positive integer.

For example, when the data transmitted by the memory system 101 during a single read or write operation has 128 bits (i.e., 128-bit), then M is 16 and N is 8. It should be noted that in other embodiments, depending on the number of bits of data transmitted by the memory system during the read or write operation, M may be another suitable positive integer, as long as M*N is equal to the number of bits of data transmitted during the read or write operation.

Figure 5:
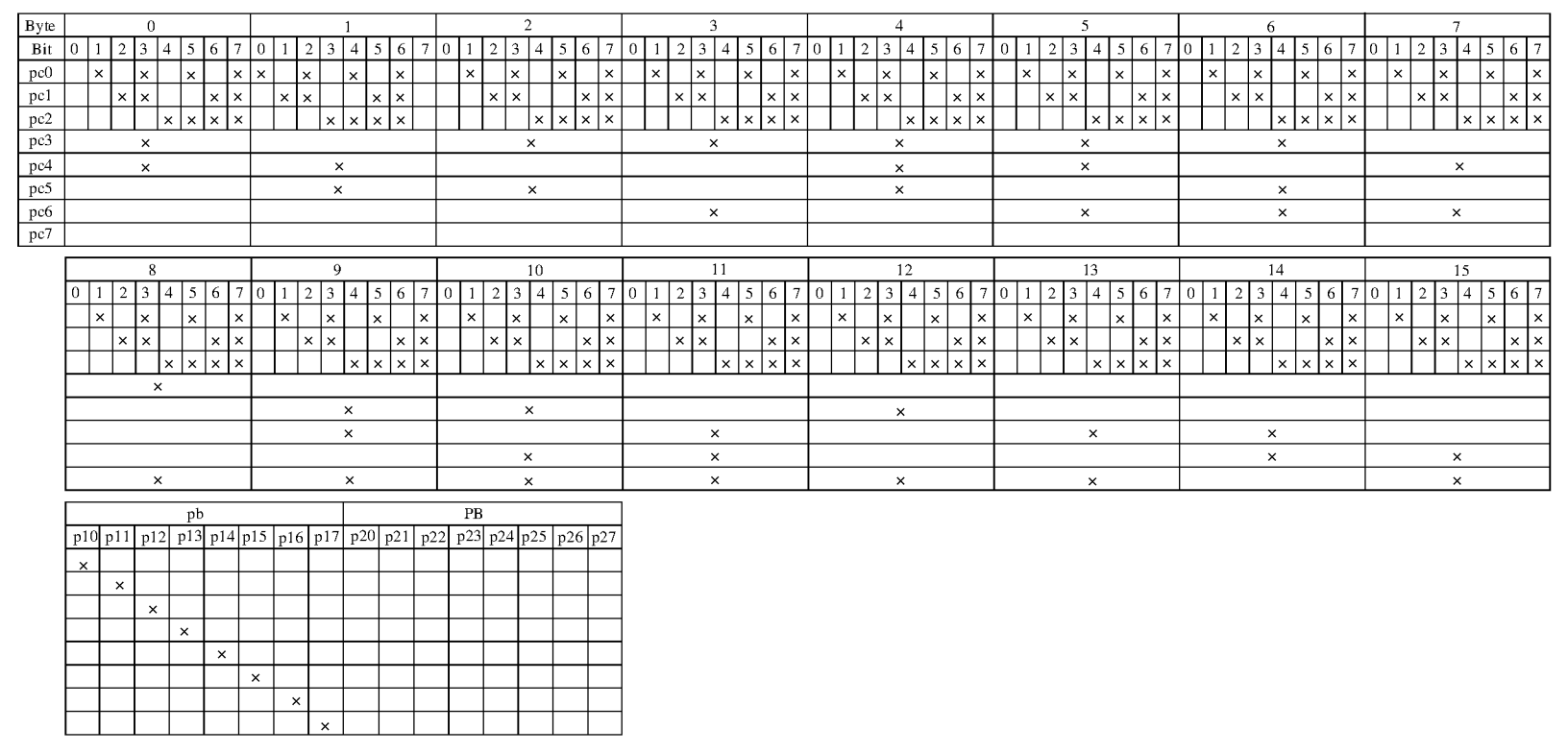

FIG. 5 is a schematic diagram of a classification of multiple data and a relationship thereof with first check codes and second check codes according to an embodiment of the disclosure. Each of N data has a different bit. In the embodiment of the disclosure, as shown in FIG. 5, for each byte, the N data have bits from zero to seven, which are incremental by a natural number; for all the bytes, the M bytes are partitioned into sixteen bytes from zero to fifteen, which are incremental by a natural number. In addition, for each of different bytes, the N data in the byte have eight bits increasing from zero to seven.

It should be noted that in FIG. 5, a table which is actually in the same row is split into three tables due to space limitations, which is actually a complete table. For ease of illustration, FIG. 6 is a schematic enlarged diagram illustrating first check codes corresponding to byte 0.

Figures 6, 7, 8:
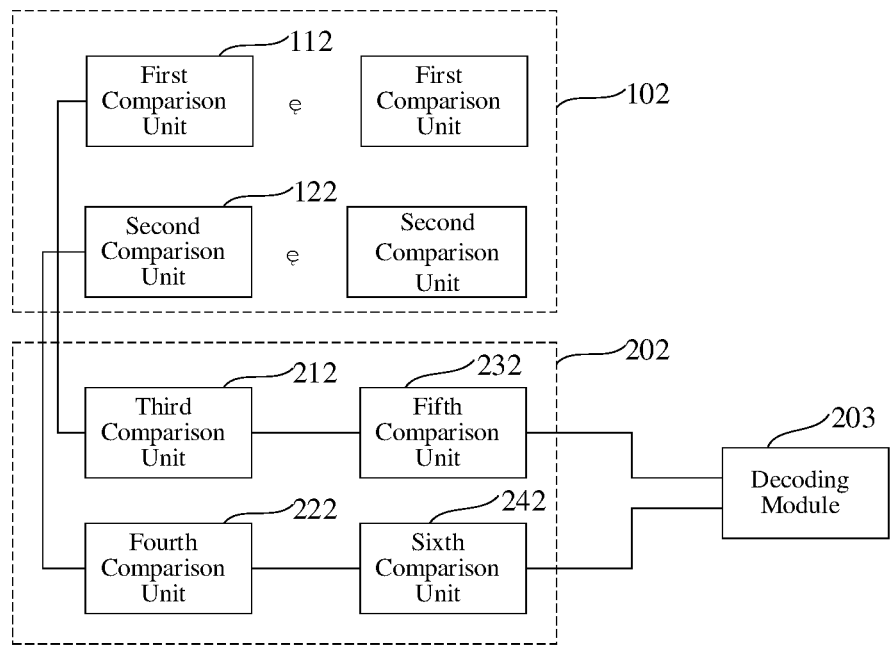
FIG. 6 schematically illustrates an enlarged diagram of first check codes corresponding to byte 0.
FIG. 7 is a functional block diagram of a comparison system according to some embodiments of the disclosure.
FIG. 8 schematically illustrates a schematic principle diagram of performing a second encoding operation on all bytes.

FIG. 7 is a functional block diagram of a comparison system according to an embodiment of the disclosure. As shown in FIG. 7, the comparison system 20 (referring to FIG. 4) includes: a first comparison module 102 formed by multiple aforementioned comparison circuits and configured to, during the write operation of the memory system 101 (referring to FIG. 4), receive the multiple data and perform comparison to generate the X first check codes and the Y second check codes.

The first comparison module 102 includes multiple comparison circuits so that the XOR operation or the XNOR operation may be performed on a subset of the multiple data to generate the first check code(s) and the second check code(s).

In the embodiment of the disclosure, as shown in FIG. 7, the first comparison module 102 includes: multiple first comparison units 112, each configured to, during the write operation of the memory system 101, receive a subset of data in each of the bytes and perform comparison and output a respective one of the first check codes, here the subset of data received by each of the first comparison units 112 are from a respective different combination of bits in the bytes; and multiple second comparison units 122, each of which configured to, during the write operation of the memory system 101, receive all data in a respective subset of the bytes and perform comparison and output a respective one of the second check codes, here the data received by each of the second comparison units 122 are from a respective different subset of the bytes.

The first comparison unit 112 is formed by a subset of the aforementioned comparison circuits, and the second comparison unit 122 is formed by a subset of the aforementioned comparison circuits. The first comparison unit 112 and the second comparison unit 122 will be described in detail below.

$2^X$ is greater than or equal to N, each of the first check codes is obtained by performing a first encoding operation on the subset of the data in all the bytes, and each of the first check codes corresponds to a respective subset of the data, which correspond to a respective bit combination for the bytes. In other words, That is, each of the first check codes is obtained by selecting data of multiple bits in each of the bytes to perform the first encoding operation, and the selected bit combinations for all bytes are the same for the same first check code, and the selected bit combinations of the N data are different for different first check codes.

In the embodiment of the disclosure, different first check codes are obtained by performing the first encoding operation based on different data in all bytes, so that the bits affecting the result of the first check codes are different for different first check codes. Furthermore, since $2^X$ is greater than or equal to N, the first check codes obtained by selecting each of the bits to perform the first encoding operation may not be exactly the same, so that the specific bit to which the erroneous data corresponds may be obtained by analysis. Here, the first encoding operation is performed by the first comparison unit 112, that is, the XOR operation or the XNOR operation is performed by the first comparison unit 112.

In the embodiment of the disclosure, M is 16, N is 8 and X is 3; a number of the first comparison units 112 is 3, and a number of the second comparison units 122 is 5. X is 3, so that errors of data of different bits may be identified, and the complexity of the hardware circuit of the first comparison unit 112 may be reduced.

In some embodiments of the disclosure, the three first check codes include a first check code at the zeroth bit, a first check code at the first bit, and a first check code at the second bit in a sequence from a lower bit to a higher bit, and the N data have bits from zero to N−1, which are incremental by a natural number. For example, the zeroth bit does not participate in the first encoding operation corresponding to any of the first check codes; the first bit participates in the first encoding operation corresponding to the first check code at the zeroth bit; the second bit participates in the first encoding operation corresponding to the first check code at the first bit; the third bit participates in the first encoding operation corresponding to the first check codes at the zeroth and first bits; the fourth bit participates in the first encoding operation corresponding to the first check code at second bit; the fifth bit participates in the first encoding operation corresponding to the first check codes at the zeroth and second bits; the sixth bit participates in the first encoding operation corresponding to the first check codes at the first and second bits; the seventh bit participates in the first encoding operation corresponding to the first check codes at the zeroth, first and second bits. It should be understood that those skilled in the art may set the number of the first check codes and other encoding operation relationships as required, as long as the first check codes obtained by selecting each of the bits to perform the first encoding operation are not exactly the same.

For example, the first encoding operation is an XOR operation, and accordingly, the three first comparison units 112 are configured as follows: one of the first comparison units 112 is configured to perform the XOR operation on data at first, third, fifth and seventh bits of all the bytes, to generate the first check code at a lowest bit; another one of the first comparison units 112 is configured to perform the XOR operation on data at fourth, fifth, sixth and seventh bits of all the bytes, to generate the first check code at a highest bit; and yet another one of the first comparison units 112 is configured to perform the XOR operation on data at second, third, sixth and seventh bits of all the bytes, to generate the first check code at an intermediate bit.

It should be noted that in other embodiments, the first encoding operation may also be an XNOR operation; and accordingly, one of the first comparison units is configured to perform the XNOR operation on data at first, third, fifth and seventh bits of all the bytes, to generate one of the first check codes; another one of the first comparison units is configured to perform the XNOR operation on data at fourth, fifth, sixth and seventh bits of all the bytes, to generate another one of the first check codes; and yet another one of the first comparison units is configured to perform the XNOR operation on data at second, third, sixth and seventh bits of all the bytes, to generate yet another one of the first check codes.

Each of the second comparison unit 122 is configured to generate a respective one of the second check codes, and the Y second check codes constitute a Y-bit second binary number; here 2Y is greater than or equal to M, and each of the second check codes is obtained by performing a second encoding operation on a subset of the bytes. In the embodiment of the disclosure, the second encoding operation is implemented by the second comparison unit 122, and may be an XNOR operation or an XOR operation.

Since $2^Y$ is greater than or equal to N, it can be ensured that the second check codes obtained by each of the bytes participating in the second encoding operation are not exactly the same. In the embodiment of the disclosure, different second check codes are obtained by performing the second encoding operation based on different subsets of bytes, so that for different second check codes, the bytes affecting the result of the second check code are different, to facilitate comprehensive analysis, to know the specific byte in which an erroneous data is present, to finally determine in which byte and at which bit the erroneous data is present, by considering the specific bit of the byte at which an erroneous data is present. It should be noted that the meaning of affecting the result of the second check code as mentioned here is that when the second encoding operation is performed again to obtain the specific second check code after an erroneous data is present in a specific byte, this second check code will be different from the second check code formed before the erroneous data is present. In the embodiment of the disclosure, Y is 5, so that errors of data of different bits can be identified, and the complexity of the hardware circuit of the second comparison unit 122 can be reduced.

In the embodiment of the disclosure, the M bytes are divided into zeroth to fifteenth bytes which are incremental by a natural number; the Y second check codes are divided into third to seventh second check codes which are incremental by a natural number; the acquisition of the five second check codes are as follows.

The third second check code (corresponding to p13 in FIG. 5) is an XOR or XNOR operation on all data of the zeroth, second, third, fourth, fifth, sixth and eighth bytes; the fourth second check code (corresponding to p14 in FIG. 5) is an XOR or XNOR of all data of the zeroth, first, fourth, fifth, seventh, ninth, tenth and twelfth bytes; the fifth second check code (corresponding to p15 in FIG. 5) is an XOR or XNOR of all data of the first, second, fourth, sixth, ninth, eleventh, thirteenth and fourteenth bytes; the sixth second check code (corresponding to p16 in FIG. 5) is an XOR or XNOR of all data of the third, fifth, sixth, seventh, tenth, eleventh, fourteenth and fifteenth bytes; the seventh second check code (corresponding to p17 in FIG. 5) is an XOR or XNOR of all data of the eighth, ninth, tenth, eleventh, twelfth, thirteenth and fifteenth bytes.

It should be noted that each of the second check codes is obtained by the XOR operation; in an embodiment, each of the second check codes is obtained by the XNOR operation.

Accordingly, a circuit corresponding to the second comparison unit 122 is designed to:

perform an XOR operation on XOR results of byte 0 and byte 4 to obtain a result 0_4; perform an XOR operation on results of byte 2 and byte 6 to obtain a result 2_6;

perform an XOR operation on results of byte 3 and byte 5 to obtain a result 3_5; perform an XOR operation on results of byte 1 and byte 5 to obtain a result 1_5; perform an XOR operation on results of byte 1 and byte 4 to obtain a result 1_4.

It is not difficult to find that as shown in FIG. 8, FIG. 8 schematically illustrates a schematic principle diagram of performing a second encoding operation on all bytes. Compared to bytes 0 to 7, the same set of circuits may be used to complete the operation on bytes 8 to 15, that is, only the input is changed, and the same operation may be performed on bytes 8 to 15 to obtain a result 9_13, a result 10_12, a result 11_15, a result 10_14 and a result 11_14. Furthermore, in addition to these operations using the same circuit, it is necessary to perform an XOR operation on byte 6 and byte 7 to obtain a result 6_7, and perform an XOR operation on results of byte 7 and byte 9 to obtain a result 7_9.

The XOR operation is performed according to the requirement of formulas pc3 to pc7: for example, the XOR operation is performed on the result 0_4, the result 2_6, the result 3_5, and the XOR result of the byte 8 according to the formula pc3 to obtain the second check code p13 (referring to FIG. 5); the XOR operation is performed on the result 0_4, the result 1_5, the result 7_9, and the result 10_12 according to the formula pc4 to obtain the second check code p14 (referring to FIG. 5). The acquisition of the second check codes p15, p16 and p17 (referring to FIG. 5) are not described one by one in detail. It may be understood that the result 0_4, the result 2_6, and the like may be reused to save circuit resources.

Furthermore, in the embodiment of the disclosure, the second comparison unit 122 may be further configured such that a number of times that each of the bytes participates in the second encoding operation is a, here a is a positive integer greater than or equal to (Y−1)/2 and less than or equal to (Y+1)/2. With this configuration, in the decoding circuit required to perform the subsequent decoding phase, the wire and area of the circuit may be reduced, and the decoding speed may be increased.

The principle of generating the first check code(s) will be described below with reference to FIGS. 5 and 6.

As shown in FIGS. 5 and 6, "x" represents currently participating in the encoding operation in this row, i.e., XNOR or XOR; and the 128-bit data is partitioned into sixteen bytes numbered from zero to fifteen, each byte having eight bits. p10, p11 and p12 represent three first check codes; p13, p14, p15, p16 and p17 represent five second check codes; pc0 to pc7 represent eight formulas corresponding to p10 to p17 respectively when the encoding operation is performed. In each row, all positions marked by "x" represent that data corresponding to this column needs to participate in XOR or XNOR in this formula. The first check code(s) and the second check code(s) correspond to PB.

During the first encoding operation or the second encoding operation of the encoding stage, the first encoding operation or the second encoding operation is performed by using the eight formulas from pc0 to pc7, the results of the operations are stored in p10 to p17, respectively, and p10 to p17 do not participate in the first encoding operation or the second encoding operation. At the decoding phase, formulas corresponding to rows are not changed, and the stored p10 to p17 need to participate in the operation. Therefore, in the table of FIG. 5, p10 to p17 are marked by "x" correspondingly, which will be described in detailed later.

In the embodiment of the disclosure, at the encoding stage: for each byte, XOR or XNOR operation is performed on data at first, third, fifth and seventh bits of the byte, and then XOR or XNOR operation is performed on all XOR or XNOR results of sixteen bytes, which is the formula pc0, and the result of the operation is given to p10. For each byte, XOR or XNOR operation is performed on data at second, third, sixth and seventh bits of the byte, and then XOR or XNOR operation is performed on all XOR or XNOR results of sixteen bytes, which is formula pc1, and the result of the operation is given to p11. For each byte, XOR or XNOR operation is performed on data at fourth, fifth, sixth and seventh bits of the byte, and then an XOR or XNOR operation is performed on all XOR or XNOR results of sixteen bytes, which is formula pc2, and the result of the operation is given to p12.

p10, p11, and p12 constitute a first binary number, and p10 is the lowest bit and p12 is the highest bit. In the case where only one of multiple data in the memory system (referring to FIG. 4) is erroneous, it is not difficult to find that:

When the data at the zeroth bit is erroneous, each of the first check codes p10, p11 and p12 is not affected since the zeroth bit does not participate in the formulas pc0, pc3 and pc3;

When the data at the first bit is erroneous, the first check code p10 is affected while the first check codes p11 and p12 are not affected since the first bit participates in the formula pc0 and does not participate in the formulas pc1 and pc2;

When the data at the second bit is erroneous, the first check codes p10 and p12 are not affected while the first check code p11 is affected since the second bit participates in the formula pc1;

When the data at the third bit is erroneous, the first check codes p10 and p11 are affected while the first check code p12 is not affected since the third bit participates in the formulas pc0 and pc1;

By analogy, when the data at the seventh bit is erroneous, each of the first check codes p10, p11 and p12 is affected since the seventh bit participates in the formulas pc0, pc1 and pc2.

It should be noted that a specific first check code is affected after a specific data is erroneous, it means that the specific first check code obtained by re-performing the first encoding operation after the specific data is erroneous, is different from the first check code formed before the data is erroneous.

It may be understood that for each formula, since the bits participating in the first encoding operation are the same among different bytes, it may be known at which bit an erroneous data is present by the first check code, but it cannot be detected in which byte an erroneous data is present at the corresponding bit. Therefore, it is also necessary to use the second check code to know in which byte an erroneous data is present at the corresponding bit.

It is not difficult to find from the foregoing analysis that both the acquisition of the first check code(s) and the acquisition of the second check code(s) are implemented by using the XNOR or XOR operation. Therefore, the comparison system according to the embodiment of the disclosure may be applied to the memory system to acquire the first check codes and the second check codes.

Furthermore, in the embodiment of the disclosure, the comparison system 20 may further include: a second comparison module 202 (referring to FIG. 7) formed by multiple comparison circuits and configured to, during the read operation of the memory system 101, receive multiple data, the X first check codes and the Y second check codes, here one of the first check code, the second check code or the data is used as the first signal or the third signal. The second comparison module 202 is configured to perform a third encoding operation on a subset of data in each of the bytes and the X first check codes to generate X first operation codes, each corresponding to a respective one of the first check codes, and perform a fourth encoding operation on all data in a subset of the bytes and the Y second check codes to generate Y second operation codes, each corresponding to a respective one of the second check codes; here the third encoding operation is an XNOR or XOR operation, and the fourth encoding operation is an XNOR or XOR operation.

In the embodiment of the disclosure, the third encoding operation is the same as the first encoding operation in terms of the bits of the data participating in the operation, except that in the third encoding operation, the first check code also participates in the operation; the fourth encoding operation is the same as the second encoding operation in terms of the bytes participating in the operation, except that in the fourth encoding operation, the second check code also participates in the operation.

In general, the decoding stage occurs during data is read at the read operation. In the embodiment of the disclosure, with reference to FIG. 5 and the forgoing descriptions of the principle of generating the first check codes and the second check codes, it is necessary for the encoding operation at the decoding stage to perform an XOR operation on the first check code p10, p11 or p12 respectively based on the forgoing encoding operation at the encoding stage, to obtain the first operation code p20, p21 or p22 respectively. That is, the first operation code p20 is obtained by performing the third encoding operation on the received data of different bits in each of the bytes and the first check code p10 by using the formula pc0; the first operation code p21 is obtained by performing the third encoding operation on the received data of different bits in each of the bytes and the first check code p11 by using the formula pc1; the first operation code p22 is obtained by performing the third encoding operation on the received data of different bits in each of the bytes and the first check code p12 by using the formula pc2. The first operation code and the second operation code correspond to PB in FIG. 5.

Similarly, for the second check code and the second operation code, it is necessary for the encoding operation at the decoding stage to perform an XOR operation on the second check code p13, p14, p15, p16 or p17 respectively based on the forgoing encoding operation at the encoding stage, to obtain the second operation code p23, p24, p25, p26 or p27 respectively.

p20, p21 and p22 constitute a second binary number, and p20 is the lowest bit and p22 is the highest bit. In the case where only one of the multiple data in the memory is erroneous, when the third encoding operation is an XOR (which may also be XNOR in other embodiments), it is not difficult to find that:

When the data at the zeroth bit is erroneous, each of the first operation codes p20, p21 and p22 is zero since the zeroth bit does not participate in the formulas pc0, pc3 and pc3, and a decimal number corresponding to the second binary number 000 is zero, so that the erroneous data at the zeroth bit is detected.

When the data at the first bit is erroneous, the first operation code p20 is 1 while the first operation codes p21 and p22 are zero since the first bit participates in the formula pc0 and does not participate in the formulas pc1 and pc2, and a decimal number corresponding to the second binary number 001 is 1, so that the erroneous data at the first bit is detected.

When the data at the second bit is erroneous, the first operation code p20 is zero, the first operation code p21 is 1 while the first operation code p22 is zero since the second bit participates in the formula pc1, and a decimal number corresponding to the second binary number 010 is 2, so that the erroneous data at the second bit is detected.

When the data at the third bit is erroneous, each of the first operation codes p20 and p21 is 1 while the first operation code p22 is zero since the third bit participates in the formulas pc0 and pc1, and a decimal number corresponding to the second binary number 011 is 3, so that the erroneous data at the third bit is detected.

By analogy, when the data at the seventh bit is erroneous, each of the first operation codes p20, p21 and p22 is 1 since the seventh bit participates in the formulas pc0, pc1 and pc2, and a decimal number corresponding to the second binary number 111 is seven, so that the erroneous data at the seventh bit is detected.

Referring to FIG. 7, it may be known from the above principle of acquiring the first and second formulas that the second comparison module 202 includes:

multiple third comparison units 212, each including at least one aforementioned comparison circuit and configured to, during the read operation of the memory system, receive and compare a subset of data in each of the bytes, and output a first updated check code, the subset of data received by each of the third comparison units 212 are from a respective different combination of bits in the bytes;

multiple fourth comparison units 222, each including at least one aforementioned comparison circuit and configured to, during the read operation of the memory system, receive and compare all data in a subset of the bytes, and output a second updated check code, here the data received by each of the fourth comparison units 222 are from a respective different subset of the bytes;

multiple fifth comparison units 232, each including at least one aforementioned comparison circuit and configured to take a respective one of the first check codes as the first signal and a respective one of the first updated check codes as the third signal, and output a respective one of the first operation codes; and multiple sixth comparison units 242, each including at least one aforementioned comparison circuit and configured to take a respective one of the second check codes as the first signal and a respective one of the second updated check codes as the third signal, and output a respective one of the second operation codes.

In the embodiment of the disclosure, a number of the third comparison units 212 may be the same as a number of the first comparison units 112, and a number of the fourth comparison units 222 may be the same as a number of the second comparison units 122. It may be understood that in the embodiment of the disclosure, the third comparison unit 212 and the aforementioned first comparison unit 112 may share a comparison circuit, and the fourth comparison unit 222 and the aforementioned second comparison unit 122 may share a comparison circuit.

Figure 9:
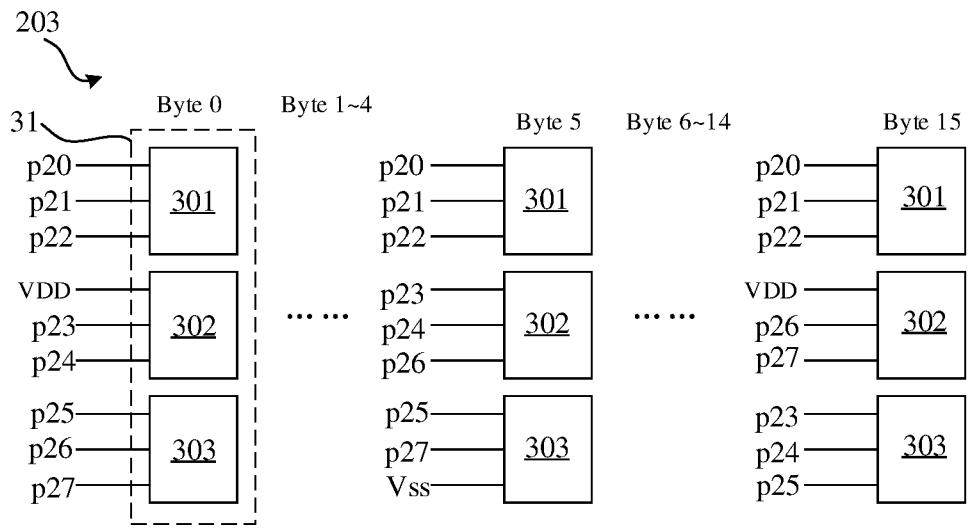
FIG. 9 is a schematic structural diagram of a decoding module in a memory system according to an embodiment of the disclosure.

In the embodiment of the disclosure, referring to FIGS. 7 and 9, the comparison system 20 further includes: a decoding module 203, configured to receive the X first operation codes and the Y second operation codes, and to locate erroneous data. In the embodiment of the disclosure, the X first operation codes are used to locate the bit where the error occurs, and the Y second operation codes are used to locate the byte where the error occurs. For specific principles and descriptions of the first operation code and the second operation code locating erroneous data, it may refer to the foregoing descriptions of the first check codes and the second check codes, and will not be elaborated here.

FIG. 9 is a schematic structural diagram of a decoding module in a memory system according to an embodiment of the disclosure. Referring to FIG. 9, the decoding module 203 includes M decoding units 31, each corresponding to a respective one of the bytes, and configured to perform decoding on the X first operation codes and the Y second operation codes to determine whether the respective byte has erroneous data and to locate the bit(s) of the erroneous data.

In FIG. 9, the first operation codes are marked by p20, p21 and p22, and the second operation codes are marked by p23, p24, p25, p26 and p27. In the embodiment of the disclosure, each of the decoding units 31 performs decoding on the X first operation codes and the Y second operation codes corresponding to the byte.

That is, the number of decoding units 31 is the same as the number of bytes.

Figure 10:
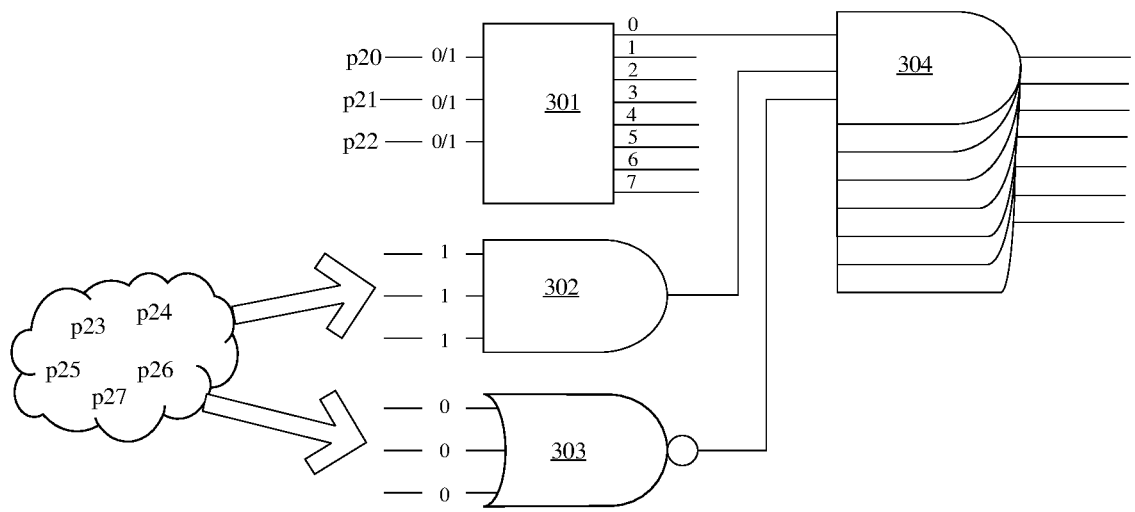
FIG. 10 is an enlarged schematic structural diagram of a decoding unit corresponding to byte 5 in a decoding module according to an embodiment of the disclosure.

FIG. 10 is an enlarged schematic structural diagram of a decoding unit corresponding to byte 5 in a decoding module according to an embodiment of the disclosure.

Referring to FIG. 10, in the embodiment of the disclosure, the decoding unit 31 (referring to FIG. 9) includes: a decoder 301, configured to receive the X first operation codes and output N first decoded signals, each of the N first decoded signals corresponding to a respective one bit of the N data; a first AND gate unit 302, configured to receive at least two selected operation codes and perform a logical AND operation, the selected operation codes being the second operation codes obtained by performing the encoding operation on a subset of the Y second check codes corresponding to the respective byte; an NOR gate unit 303, configured to receive at least two unselected operation codes and perform a logical NOR operation, the unselected operation codes being the second operation codes other than the selected operation codes corresponding to the respective byte; and N second AND gate units 304, each having an input terminal connected to an output terminal of the first AND gate unit 302, an output terminal of the NOR gate unit 303 and one of the first decoded signals, here a position of erroneous data is acquired based on outputs of the N second AND gate units 304. It should be noted that the second check code corresponding to the respective byte herein means that the byte is selected to participate in the second check code formed by the second encoding operation. For example, as may be seen in FIG. 5, the second check codes corresponding to the zeroth byte are p13 and p14.

It should be noted that FIG. 10 merely illustrates a connection relationship between a first decoded signal and a second AND gate unit 304.

In the embodiment of the disclosure, the decoder 301 is a three-eight decoder having three input terminals for receiving three first operation codes, eight output terminals for outputting eight first decoded signals, each characterizing a condition of data at a respective one of eight bits in the same byte.

In the embodiment of the disclosure, each of the first operation codes p20, p21 and p22 is zero or one, and the output terminals are marked by zero to seven. When an error occurs at the zeroth bit, and the zeroth bit does not participate in the encoding operation of the first operation code, then each of p20, p21 and p22 is zero, and accordingly, the "zero" output terminal is one, and each of the remaining output terminals is zero. When an error occurs at the first bit, p20 is one and each of p21 and p22 is zero, and accordingly, the "one" output terminal is one, and each of the remaining output terminals is zero. By analogy, when an error occurs at the seventh bit, each of p20, p21 and p22 is one, and accordingly, the "seven" output terminal is one, and each of the remaining output terminals is zero.

It should be noted that in other embodiments, the number of the input terminals and the number of the output terminals of the decoder may be reasonably set according to the first check codes and the number of bits in each of the bytes.

The first AND gate unit 302 has a characteristic that the output terminal is one when each of the input terminals is one, and the output terminal is zero when one or more of the input terminals are zero. In the embodiment of the disclosure, the first AND gate unit 302 has three input terminals, and is further configured to connect one of the input terminals of the first AND gate unit 302 to a power supply $V_{DD}$ when a number of the selected operation codes is 2.

The NOR gate unit 303 has a characteristic that the output terminal is one when each of the input terminals is zero, and the output terminal is zero when one or more of the input terminals are one. In the embodiment of the disclosure, the NOR gate unit 303 has three input terminals, and is further configured to connect one of the input terminals of the NOR gate unit 303 to the ground Vss when a number of the unselected operation codes is 2.

In the embodiment of the disclosure, the selected operation code corresponds to a second operation code obtained after performing the fourth encoding operation on the second check codes corresponding to the byte; and the unselected operation code corresponds to a second operation code obtained after performing the fourth encoding operation on the remaining second check codes other than the second check codes corresponding to the byte.

For example, for byte 0, the second operation codes p23 and p24 are second operation codes obtained by performing the fourth encoding operation on the second check codes p13 and p14 corresponding to byte 0, and the second operation codes p23 and p24 are input to the input terminals of the first AND gate unit 302, and the remaining second operation codes p25, p26 and p27 are input to the input terminals of the NOR gate unit 303. For byte 1, the second operation codes p24 and p25 are second operation codes obtained by performing the fourth encoding operation on the second check codes p14 and p15 corresponding to byte 1, and the second operation codes p24 and p25 are input to the input terminals of the first AND gate unit 302, and the remaining second operation codes p23, p26 and p27 are input to the input terminals of the NOR gate unit 303. For byte 4, the second operation codes p23, p24 and p25 are input to the input terminals of the first AND gate unit 302, and the remaining second operation codes p26 and p27 are input to the input terminals of the NOR gate unit 303. Operations for other bytes will not be enumerated one by one.

The number of the second AND gate units 304 is the same as the number of bits in the same byte. In the embodiment of the disclosure, N is eight, and accordingly, there are eight second AND gate units 304, and it is determined whether the byte has erroneous data and in which bit the error occurs according to the output of the eight second AND gate units 304.

It is not difficult to find that in the embodiment of the disclosure, the circuit of the decoding unit 31 is the same for each of the bytes except that the wiring of the input terminals is different, and the wiring of the input terminals of the first AND gate unit 302 and the NOR gate unit 303 corresponding to each of the bytes is determined by the five formulas pc3 to pc7 in FIG. 2. The second operation codes obtained by performing the fourth encoding operation on the second check codes corresponding to each of the bytes, are connected to the input terminals of the first AND gate unit 302, and the second operation codes obtained by performing the fourth encoding operation on the remaining second operation codes other than the second check codes corresponding to each of the bytes, are connected to the input terminals of the NOR gate unit 303. Furthermore, unused input terminals of the first AND gate unit 302 are connected to the power supply, unused input terminals of the NOR gate unit 303 is grounded, and the first operation code is connected to an input terminal of the decoder 301. Therefore, the decoder 301 uses only eight wires to connect the input terminals, and each of the wires transmits one of the first operation codes or one of the second operation codes, thereby saving the wires and area, while facilitating to increase the decoding speed.

In order to facilitate understanding of the decoding circuit, a decoding unit corresponding to byte 5 is used as an example, and the decoding circuit will be described in more detail below with reference to the operating principle of the decoding circuit.

When each of the outputs of the eight second AND gate units 304 is zero, it means that none of the data in the byte are erroneous.

When one of the outputs of the eight second AND gate units 304 is one, it means that data of one bit in the byte is erroneous. In the embodiment of the disclosure, data of the byte is erroneous, each of the second operation codes p23, p24 and p26 is one and the output of the first AND gate unit 302 is one, each of the unselected operation codes p25 and p27 is zero and the output of the NOR gate unit 303 is one. At this time, when the output of one of the N second AND gate unit 304, corresponding to a first decoded signal, is one, then it can be determined that data at the bit corresponding to the first decoded signal is erroneous.

It may be understood that in the embodiment of the disclosure, it is taken as an example that when the first decoded signal is 1, data at the corresponding bit is erroneous, and when the first decoded signal is 0, data at the corresponding bit is not erroneous. In some embodiments of the disclosure, it may be designed that when the first decoded signal is 0, data at the corresponding bit is erroneous, and when the first decoded signal is 1, data at the corresponding bit is not erroneous. Accordingly, those skilled in the art may design other conditions according to requirements, for example, the first decoded signal is connected to an NOR gate circuit for output, etc.

It should be noted that when all data in the M bytes are not erroneous and only one of the X first check codes is erroneous, one of the first operation codes is one, and then one of the outputs of the decoder 301 is one. However, since the Y second check codes are not erroneous, each of the second operation codes is zero, and then the output of the first AND gate unit 302 and the output of the second AND gate unit 304 are zero, which means that none of data in the M bytes are erroneous. When none of the data in the M bytes are erroneous and only one of the Y second check codes is erroneous, the first operation code is zero, and then the "zero" output terminal of the decoder 301 is one. However, since none of the remaining Y−1 second check codes is erroneous, each of Y−1 second operation codes corresponding thereto is zero, the output of the first AND gate unit 302 is zero, and then the output of the second AND gate unit 304 is zero, which means that none of the data in the M bytes are erroneous.

It may be understood that in the embodiment of the disclosure, the first operation code is generated based on the first check code, and the erroneous data in the byte is located by using the first operation code generated based on the first check code. Therefore, the first check code(s) is/are configured for at least one of error detection or error correction on the N data in each of the bytes. A second operation code is generated based on the second check code(s), and the erroneous byte is located by using the second operation code generated based on the second check code(s). Therefore, the second check code(s) is/are configured for at least one of error detection or error correction on the M bytes.

Embodiments of the disclosure provide a comparison system having excellent structural performance. When the comparison system is applied to a memory system, it may detect and correct one-bit error, and may also reduce hardware circuits, thereby reducing power consumption of the memory system and improving the encoding speed and the decoding speed, and improving the speed of the memory system performing the error detection and error correction. Furthermore, the special design of the first check code(s) and the second check code(s) allows the difference in encoding time for all data combinations to be small, and the difference in decoding time for all data combinations to be small, thereby reducing the requirement on the comparison system.

It may be understood by those of ordinary skill in the art that the embodiments as described above are specific embodiments of the disclosure, and that various changes may be made to the form and detail thereof in practical applications without departing from the spirit and scope of the disclosure. Any of those skilled in the art may make their own changes and modifications without departing from the spirit and scope of the disclosure, therefore the scope of protection of the disclosure shall be subject to the scope defined by the claims.

Embodiments of the disclosure provide a comparison system including at least one comparison circuit, the comparison circuit including: a common module, configured to control output of the power supply signal or the ground signal based on a first signal and a second signal which are inverted; a first logical unit, connected to the common module, and configured to receive a third signal and a fourth signal which are inverted, and output a first operation signal which is an XOR of the first signal and the third signal; and a second logical unit, connected to the common module, and configured to receive the third signal and the fourth signal which are inverted, and output a second operation signal which is an XNOR of the first signal and the third signal.

Since the first logical unit and the second logical unit share the same common module, the circuit area may be reduced, and the efficiency of error detection and error correction may be improved. Furthermore, since the area occupied by the circuit of the common module is small, it is advantageous to increase the circuit area of the first and second logical units, and it may further increase the speed of the comparison system performing the XOR operation and the XNOR operation. For example, when the comparison system is applied to the memory system for error correction, it is advantageous to increase the speed of error detection and error correction in the memory system.

The invention claimed is:

1. A comparison system comprising at least one comparison circuit, each of the at least one comparison circuit comprising:
   a common module, connected to a power supply signal and a ground signal, and configured to control output of the power supply signal or the ground signal based on a first signal and a second signal which are inverted;
   a first logical unit, connected to the common module, and configured to receive a third signal and a fourth signal which are inverted, and output a first operation signal which is an exclusive OR (XOR) of the first signal and the third signal; and
   a second logical unit, connected to the common module, and configured to receive the third signal and the fourth signal, and output a second operation signal which is a not exclusive OR (XNOR) of the first signal and the third signal, wherein the comparison system is applied to a memory system which is configured to write or read, during a read operation or a write operation, a plurality of data, and the plurality of data are divided into M bytes, each having N data, wherein the comparison system is configured to receive the plurality of data, each used as the first signal or the third signal, and perform a first encoding operation based on a subset of the N data in each of the M bytes to generate X first check codes, each based on a subset of the N data at fixed bits among all the M bytes, and perform a second encoding operation based on all data in a subset of the M bytes to generate Y second check codes, wherein the X first check codes are configured for at least one of error detection or error correction on the N data in each of the M bytes, and the Y second check codes are configured for at least one of error detection or error correction on the M bytes; and each of M, N, X and Y is a positive natural number, wherein the comparison system further comprises:
a second comparison module formed by a plurality of comparison circuits and configured to, during the read operation of the memory system, receive the plurality of data, the X first check codes and the Y second check codes, wherein one of the X first check codes, the Y second check codes or the plurality of data is used as the first signal or the third signal, and wherein the second comparison module configured to perform a third encoding operation on a second subset of the N data in each of the M bytes and the X first check codes to generate X first operation codes, each corresponding to a respective one of the X first check codes, and perform a fourth encoding operation on all data in a second subset of the M bytes and the Y second check codes to generate Y second operation codes, each corresponding to a respective one of the Y second check codes, wherein the third encoding operation is an XNOR or XOR operation, and the fourth encoding operation is an XNOR or XOR operation.

2. The comparison system of claim 1, wherein the common module comprises:
a first common unit, connected to the power supply signal and configured to control output of the power supply signal based on the first signal and the second signal; and
a second common unit, connected to the ground signal and configured to control output of the ground signal based on the first signal and the second signal,
wherein the first logical unit is connected between the first common unit and the second common unit, and the second logical unit is connected between the first common unit and the second common unit.

3. The comparison system of claim 2, wherein the first common unit comprises:
a zeroth P-channel Metal Oxide Semiconductor (PMOS) transistor, having a gate for receiving the first signal and a source connected to the power supply signal; and
a seventh PMOS transistor, having a gate for receiving the second signal and a source connected to the power supply signal; and
the second common unit comprises:
a zeroth N-channel Metal Oxide Semiconductor (NMOS) transistor, having a gate for receiving the first signal and a source connected to the ground signal; and a seventh NMOS transistor, having a gate for receiving the second signal and a source connected to the ground signal.

4. The comparison system of claim 3, wherein the first logical unit comprises:
a first PMOS transistor, having a gate for receiving the fourth signal and a source connected to a drain of the zeroth PMOS transistor;
a first NMOS transistor, having a gate for receiving the third signal, a drain connected to a drain of the first PMOS transistor, and a source connected to a drain of the zeroth NMOS transistor;
a fourth PMOS transistor, having a gate for receiving the third signal and a source connected to a drain of the seventh PMOS transistor; and
a fourth NMOS transistor, having a gate for receiving the fourth signal, a drain connected to a drain of the fourth PMOS transistor, and a source connected to a drain of the seventh NMOS transistor.

5. The comparison system of claim 3, wherein the second logical unit comprises:
a second PMOS transistor, having a gate for receiving the third signal and a source connected to a drain of the zeroth PMOS transistor;
a second NMOS transistor, having a gate for receiving the fourth signal, a drain connected to a drain of the second PMOS transistor, and a source connected to a drain of the zeroth NMOS transistor;
a fifth PMOS transistor, having a gate for receiving the fourth signal and a source connected to a drain of the seventh PMOS transistor; and
a fifth NMOS transistor, having a gate for receiving the third signal, a drain connected to a drain of the fifth PMOS transistor, and a source connected to a drain of the seventh NMOS transistor.

6. The comparison system of claim 1, comprising a first comparison module formed by the plurality of comparison circuits and configured to, during the write operation of the memory system, receive the plurality of data and perform comparison to generate the X first check codes and the Y second check codes.

7. The comparison system of claim 6, wherein the first comparison module comprises:
a plurality of first comparison units, each of which configured to, during the write operation of the memory system, receive a third subset of the N data in each of the M bytes and perform comparison and output a respective one of the X first check codes, wherein the third subset of the N data received by each of the plurality of first comparison units are from a respective different combination of bits in the M bytes; and
a plurality of second comparison units, each of which configured to, during the write operation of the memory system, receive all data in a respective subset of the M bytes and perform comparison and output a respective one of the Y second check codes, wherein the data received by each of the plurality of second comparison units are from a respective different subset of the M bytes.

8. The comparison system of claim 7, wherein M is 16, N is 8, X is 3 and Y is 5; a number of the plurality of first comparison units is 3, and a number of the plurality of second comparison units is 5.

9. The comparison system of claim 1, wherein the second comparison module comprises:
a plurality of third comparison units, each configured to, during the read operation of the memory system, receive and compare a third subset of the N data in each of the M bytes, and output a first updated check code, wherein the third subset of the N data received by each of the third comparison units are from a respective different combination of bits in the M bytes;

a plurality of fourth comparison units, each configured to, during the read operation of the memory system, receive and compare all data in a fourth subset of the M bytes, and output a second updated check code, wherein the data received by each of the fourth comparison units are from a respective different subset of the M bytes;

a plurality of fifth comparison units, each configured to take a respective one of the X first check codes as the first signal and a respective one of the first updated check codes as the third signal, and output a respective one of the X first operation codes; and a plurality of sixth comparison units, each configured to take a respective one of the Y second check codes as the first signal and a respective one of the second updated check codes as the third signal, and output a respective one of the Y second operation codes.

10. The comparison system of claim 1, further comprising:

a decoding module configured to receive the X first operation codes and the Y second operation codes, and to locate erroneous data.

11. The comparison system of claim 10, wherein the decoding module comprises M decoding units, each corresponding to a respective one of the M bytes, and configured to perform decoding on the X first operation codes and the Y second operation codes to determine whether the respective one of the M bytes has erroneous data and to locate bits of the erroneous data.

12. The comparison system of claim 11, wherein the M decoding units each comprises:

a decoder, configured to receive the X first operation codes and output N first decoded signals, each of the N first decoded signals corresponding to a respective one bit of the N data;

a first AND gate unit, configured to receive at least two selected operation codes and perform a logical AND operation, the at least two selected operation codes being second operation codes obtained by performing the fourth encoding operation on a subset of the Y second check codes corresponding to the respective one of the M bytes;

an NOR gate unit, configured to receive at least two unselected operation codes and perform a logical NOR operation, the at least two unselected operation codes being second operation codes other than the at least two selected operation codes corresponding to the respective one of the M bytes; and N second AND gate units, each having an input terminal connected to an output terminal of the first AND gate unit, an output terminal of the NOR gate unit and one of the N first decoded signals, wherein a position of erroneous data is acquired based on outputs of the N second AND gate units.

13. The comparison system of claim 12, wherein the first AND gate unit has three input terminals, and is further configured to connect one of the three input terminals of the first AND gate unit to a power supply when a number of the at least two selected operation codes is 2.

14. The comparison system of claim 13, wherein the NOR gate unit has three input terminals, and is further configured to ground one of the three input terminals of the NOR gate unit when a number of the at two unselected operation codes is 2.

* * * * *